(12) United States Patent
Kim et al.

(10) Patent No.: US 8,084,840 B2
(45) Date of Patent: Dec. 27, 2011

(54) INTERPOSER INCLUDING AIR GAP STRUCTURE, METHODS OF FORMING THE SAME, SEMICONDUCTOR DEVICE INCLUDING THE INTERPOSER, AND MULTI-CHIP PACKAGE INCLUDING THE INTERPOSER

(75) Inventors: Chang-Hyun Kim, Seongnam-si (KR); Kyung-Ho Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 116 days.

(21) Appl. No.: 11/485,535

(22) Filed: Jul. 13, 2006

(65) Prior Publication Data

US 2007/0013392 A1   Jan. 18, 2007

(30) Foreign Application Priority Data

Jul. 14, 2005   (KR) .................. 10-2005-0063761

(51) Int. Cl.
*H01L 29/00* (2006.01)
(52) U.S. Cl. .................. 257/522; 257/E23.168
(58) Field of Classification Search .................. 257/414, 257/415, 419, 522, E27.006, E23.168, E25.011
See application file for complete search history.

(56) References Cited

U.S. PATENT DOCUMENTS 5,825,092 A   10/1998  Delgado et al.
6,087,701 A * 7/2000  Bergstrom et al. .......... 257/414
6,492,705 B1  12/2002  Begley et al.

FOREIGN PATENT DOCUMENTS

| EP | 0 614 221 | 9/1994 |
|---|---|---|
| JP | 04-158553 | 6/1992 |
| JP | 10-092932 | 4/1998 |
| JP | A-2000-277659 | 10/2000 |
| JP | 2001-326275 | 11/2001 |
| JP | 2003-133057 | 5/2003 |
| JP | 2004-056093 | 2/2004 |
| JP | 2004-158524 | 6/2004 |
| JP | 2005-175435 | 6/2005 |

OTHER PUBLICATIONS

Office Action dated Oct. 18, 2010 for corresponding German Patent Application No. 10 2006 033 039.0-33.

\* cited by examiner

*Primary Examiner* — Hung Vu
(74) *Attorney, Agent, or Firm* — Harness, Dickey & Pierce, P.L.C.

(57) ABSTRACT

Example embodiments of the present invention relate to an interposer of a semiconductor device having an air gap structure, a semiconductor device using the interposer, a multi-chip package using the interposer and methods of forming the interposer. The interposer includes a semiconductor substrate including a void, a metal interconnect, provided within the void, thereby forming an air gap insulating the metal interconnect. The metal interconnect may be connected to a contact element, and may be maintained within the air gap using the contact element.

8 Claims, 9 Drawing Sheets

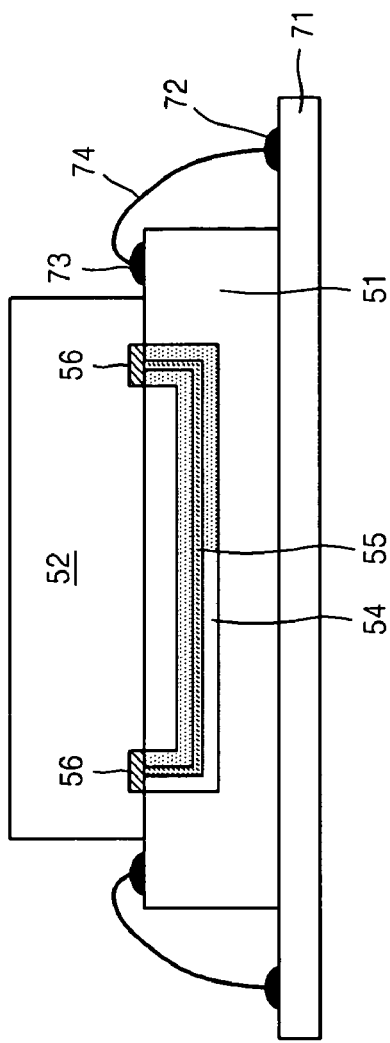
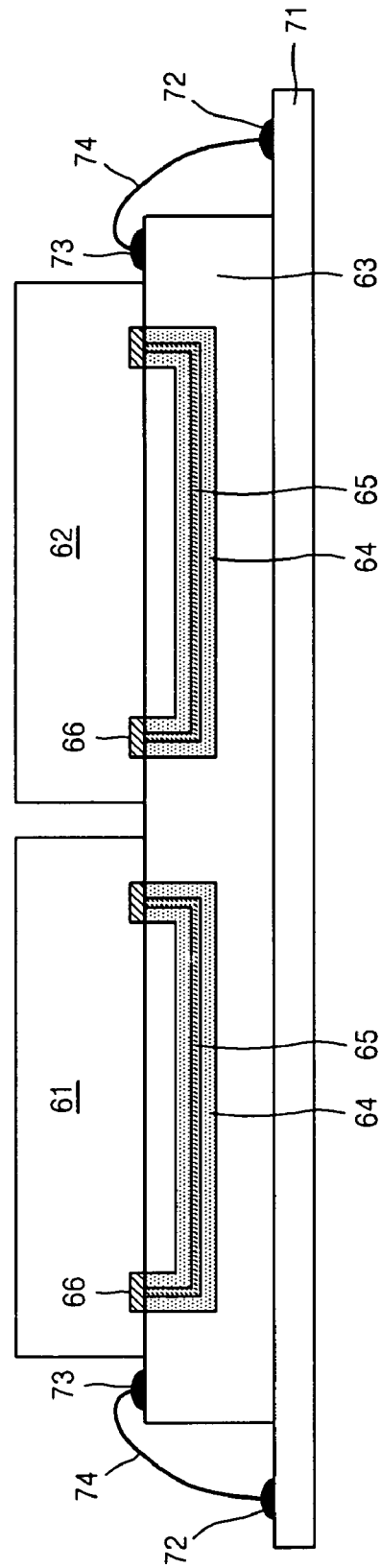

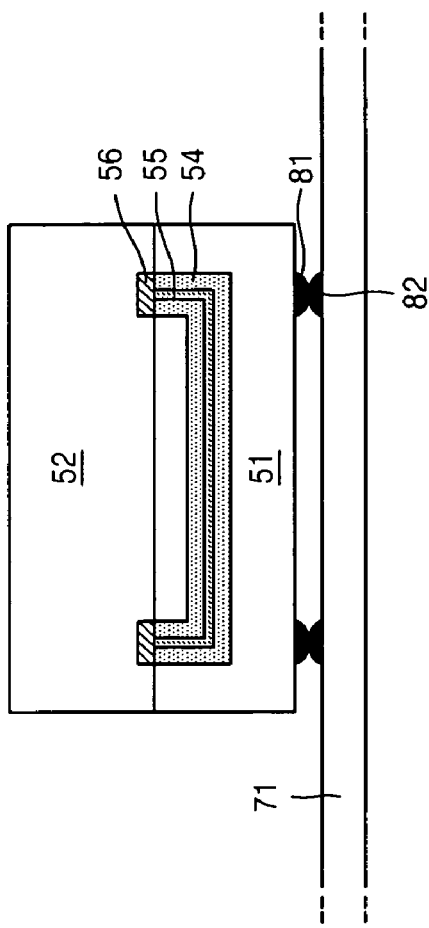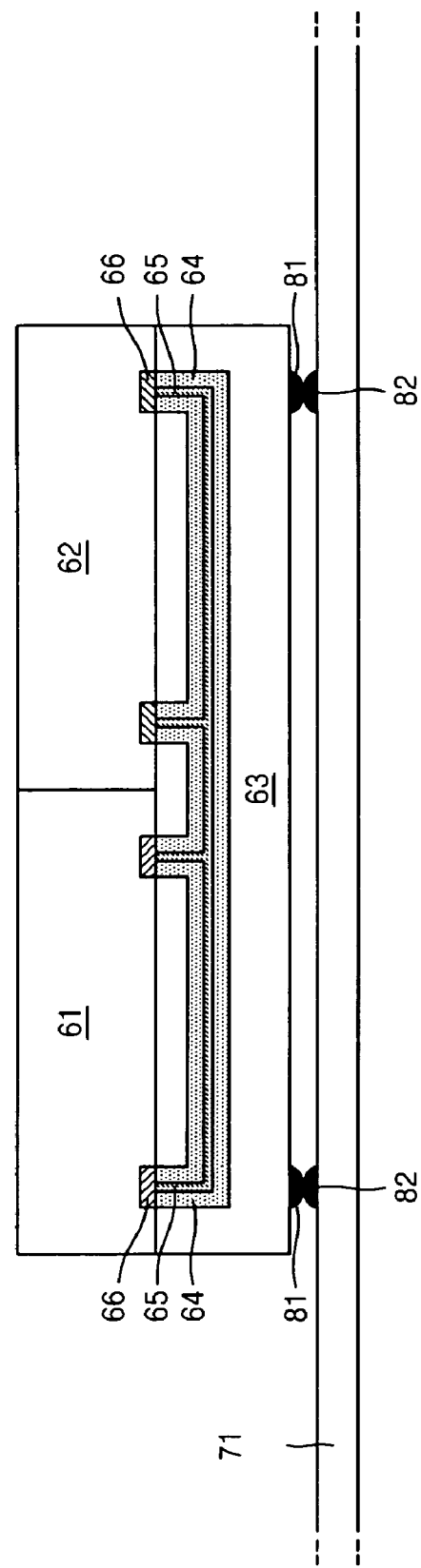

INTERPOSER INCLUDING AIR GAP STRUCTURE, METHODS OF FORMING THE SAME, SEMICONDUCTOR DEVICE INCLUDING THE INTERPOSER, AND MULTI-CHIP PACKAGE INCLUDING THE INTERPOSER

PRIORITY STATEMENT

This application claims the benefit of priority from Korean Patent Application No. 10-2005-0063761, filed on Jul. 14, 2005, in the Korean Intellectual Property Office, the disclosure of which is incorporated herein in its entirety by reference.

BACKGROUND OF THE INVENTION

1. Field of the Invention

Example embodiments of the present invention relate to an interposer of a semiconductor device having an air gap structure, a semiconductor device using the interposer, a multi-chip package using the interposer and methods of forming the interposer.

2. Description of the Related Art

In semiconductor devices, unit elements such as a plurality of transistors, resistors and capacitors may be formed on a semiconductor substrate, and may be electrically connected to constitute a semiconductor integrated circuit. The unit elements constituting the semiconductor device may be connected to one another via interconnects.

In the conventional art, the metal interconnects of semiconductor devices developed to perform higher speed operation are not formed within the semiconductor integrated circuits, but unit elements are electrically connected using a separately formed interposer.

FIG. 1 shows a construction of a semiconductor device using a conventional interposer.

Referring to FIG. 1, a semiconductor device 10 may have an interposer 11 and a semiconductor integrated circuit 12. The interposer 11 may have a semiconductor substrate 14, a metal interconnect 16, and/or an InterLayer Dielectric (ILD) layer 18. The semiconductor substrate 14 may be used to fix the metal interconnect 16 of the interposer 11, and may be used to couple the metal interconnect 16 with the semiconductor integrated circuit 12. The metal interconnect 16 may electrically connect the unit elements of the semiconductor integrated circuit 12 via contacts 19. The metal interconnect 16 may be insulated from the semiconductor substrate 14 using the ILD layer 18.

The ILD layer 18 may generally be composed of an insulating material such as $SiO_2$. A dielectric constant $\in$ of such an insulating material is greater than that of air. Therefore, an internal parasitic capacitance increased due to the ILD layer 18 makes a total capacitance C large, so that a response speed τ desired for signal transfer of the semiconductor device may be slower. That is, τ is increased because τ=R*C, where R is resistance. Thus, the reaction speed of overall operation of the semiconductor device may be slower.

In the case of a multi-chip package in which several semiconductor chips are connected as a single semiconductor device, a capacitance loading between the metal interconnects that connect the semiconductor chips may become an issue.

FIG. 2 illustrates a relation of connecting respective chips in a conventional multi-chip package.

FIG. 2A illustrates a multi-chip package in which two semiconductor chips are connected in parallel with each other, FIG. 2B illustrates a multi-chip package upon which at least two semiconductor chips are stacked, and FIG. 2C illustrates a multi-chip package in which at least two semiconductor chips are stacked and in parallel with one another.

In a multi-chip package, if semiconductor chips are connected by metal interconnects on or in a substrate as shown in FIG. 2, the response speed of the semiconductor device may be slower because of the greater capacitance loading between the interconnects. The capacitance loading problem caused by the metal interconnects may impede fabrication of integrated circuits operating at higher speed.

Moreover, as shown in FIG. 2, when semiconductor chips are connected via metal interconnects on the substrates, an area occupied by the multi-chip package may be enlarged, which may increase manufacturing costs of the semiconductor devices.

A multi-chip package may be constructed using an interposer. However, a dielectric constant of the ILD layer within the interposer may be large enough to still involve the capacitance loading problem caused by the insulating layer.

SUMMARY OF EXAMPLE EMBODIMENTS

Example embodiments of the present invention relate to an interposer of a semiconductor device with a smaller dielectric constant.

Example embodiments of the present invention relate to an interposer of a semiconductor device having an air gap structure, a semiconductor device using the interposer, a multi-chip package using the interposer and methods of forming the interposer.

Example embodiments of the present invention provide an interposer of a semiconductor device with a decreased capacitance by reducing a dielectric constant of an interposer insulating layer.

Example embodiments of the present invention also provide a semiconductor device with an improved operation reaction speed by decreasing a capacitance using an interposer insulating layer.

Example embodiments of the present invention provide a multi-chip package with a faster operation reaction speed, requiring a smaller installation area.

According to an example embodiment of the present invention, there is provided an interposer of a semiconductor device. The interposer may include a semiconductor substrate including a void and a metal interconnect provided within the void of the semiconductor substrate, thereby forming an insulating air gap to insulate the metal interconnect.

The interposer may also include a contact element formed on one side of the metal interconnect to electrically connect the metal interconnect to a semiconductor integrated circuit, and the contact element may be fixed to the semiconductor substrate.

The metal interconnect may be maintained within the air gap by the contact element. Also, the metal interconnect may be fabricated using a Micro Electro Mechanical System (MEMS).

According to another example embodiment of the present invention, there is provided a semiconductor device. The semiconductor device may include: an interposer including a semiconductor substrate including a void and a metal interconnect provided within the void of the semiconductor substrate, thereby forming an insulating air gap to insulate the metal interconnect and a semiconductor substrate to fix the metal interconnect; and a semiconductor integrated circuit including a circuit unit having internal elements such as transistors, capacitors or resistors, wherein the metal interconnect of the interposer connects the internal elements electrically to one another.

The interposer may also include a contact element formed on one side of the metal interconnect to electrically connect the metal interconnect to the semiconductor integrated circuit, and the semiconductor integrated circuit may also include a pad for connecting the circuit unit to the contact element of the interposer.

The metal interconnect may be fixed within the air gap by the contact. Moreover, the metal interconnect may be fabricated using a Micro Electro Mechanical System (MEMS).

An area of the interposer may be equal to an area of the semiconductor integrated circuit, and the interposer may also include an external pad to be connected to a printed circuit board (PCB), and the external pad may be connected to the PCB via a bonding unit.

The area of the interposer may be larger than the area of the semiconductor integrated circuit, and the interposer may also include an external pad to be connected to a PCB. In this case, the external pad may be disposed on an area of the interposer bonded to the semiconductor integrated circuit and may be connected to the PCB via the bonding unit.

According to still another example embodiment of the present invention, there is provided a multi-chip package including an interposer. The interposer may include a metal interconnect, an insulating air gap that insulates the metal interconnect from surroundings, a contact formed on one side of the metal interconnect to electrically connect the metal interconnect to a semiconductor integrated circuit, and a semiconductor substrate to fix the metal interconnect and the contact. In an example embodiment, a plurality of semiconductor integrated circuits may include a circuit unit having elements such as transistors, capacitors or resistors, and a pad for connecting the circuit unit to the contact of the interposer. The interposer may be bonded to the plurality of semiconductor integrated circuits, and connected to the circuit units of respective semiconductor integrated circuits via the contact.

According to yet another example embodiment of the present invention, there is provided a method of fabricating an interposer of a semiconductor device, in which a photoresist may be formed on a semiconductor substrate. After forming a hole or void in the semiconductor substrate using the photoresist, the photoresist may be removed. A metal interconnect may be formed within the hole such that an air gap exists between the semiconductor substrate and the metal interconnect.

According to further another example embodiment of the present invention, there is provided a method of fabricating an interposer of a semiconductor device, in which a photoresist is formed on a first semiconductor substrate. After forming a hole in the first semiconductor substrate using the photoresist, the photoresist may be removed. A metal interconnect may be formed within the hole so that an air gap exists between the semiconductor substrate and the metal interconnect. A photoresist may be formed on a second semiconductor substrate, and a hole may be formed in the second semiconductor substrate using the photoresist. The photoresist may be removed, and the metal interconnect may be formed within the hole such that an air gap exists between the semiconductor substrate and the metal interconnect. The first semiconductor substrate may be coupled to the second semiconductor substrate to bond the metal interconnects.

BRIEF DESCRIPTION OF THE DRAWINGS

The above and other features and advantages of example embodiments of the present invention will become more apparent from the following brief description taken in conjunction with the attached drawings. FIGS. 1-8B represent non-limiting, example embodiments of the present invention as described herein:

FIG. 1 is a diagram illustrating an exemplary structure of a semiconductor device using a conventional interposer;

FIG. 3 is a diagram showing a structure of an interposer according to an example embodiment the present invention;

FIG. 6 is a diagram illustrating a multi-chip package according to and example embodiment of the present invention;

FIGS. 7A-7B illustrate an example of connecting a semiconductor device to a PCB; and FIGS. 8A-8B illustrate another example of connecting the semiconductor device to the PCB.

DETAILED DESCRIPTION OF EXAMPLE EMBODIMENTS

Figure 1:
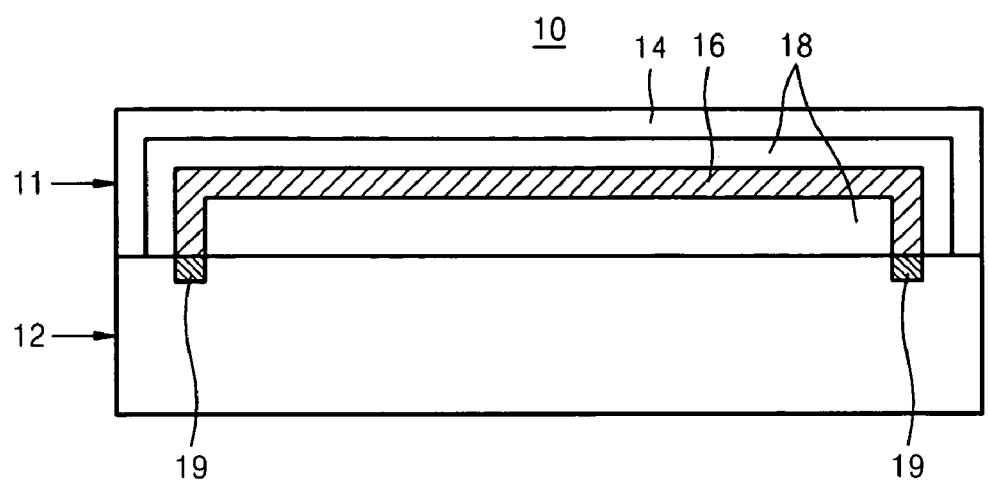
Figure 2A:
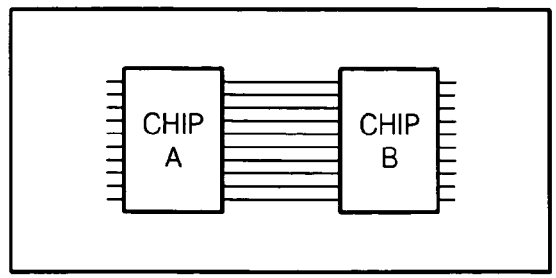
FIGS. 2A-2C depict a connection of respective chips in a conventional multi-chip package.
Figure 2B:
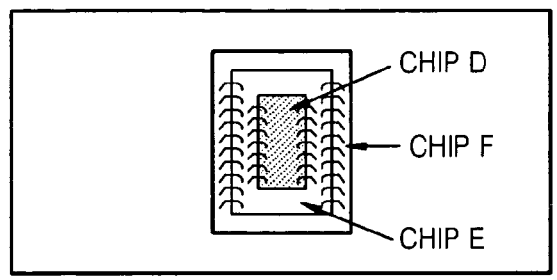
Figure 2C:
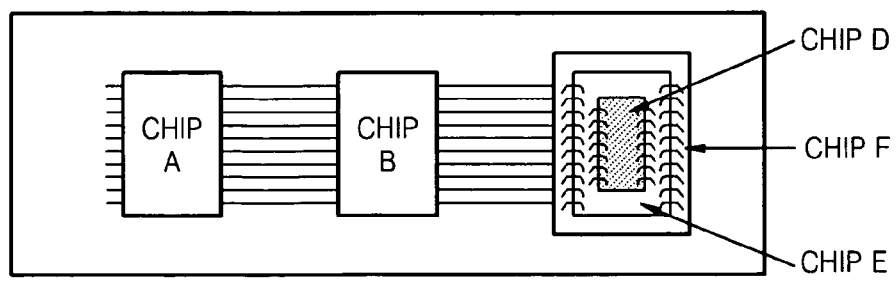

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to an interposer of a semiconductor device having an air gap structure, a semiconductor device using the interposer, a multichip package using the interposer and methods of forming the interposer.

Figure 3:
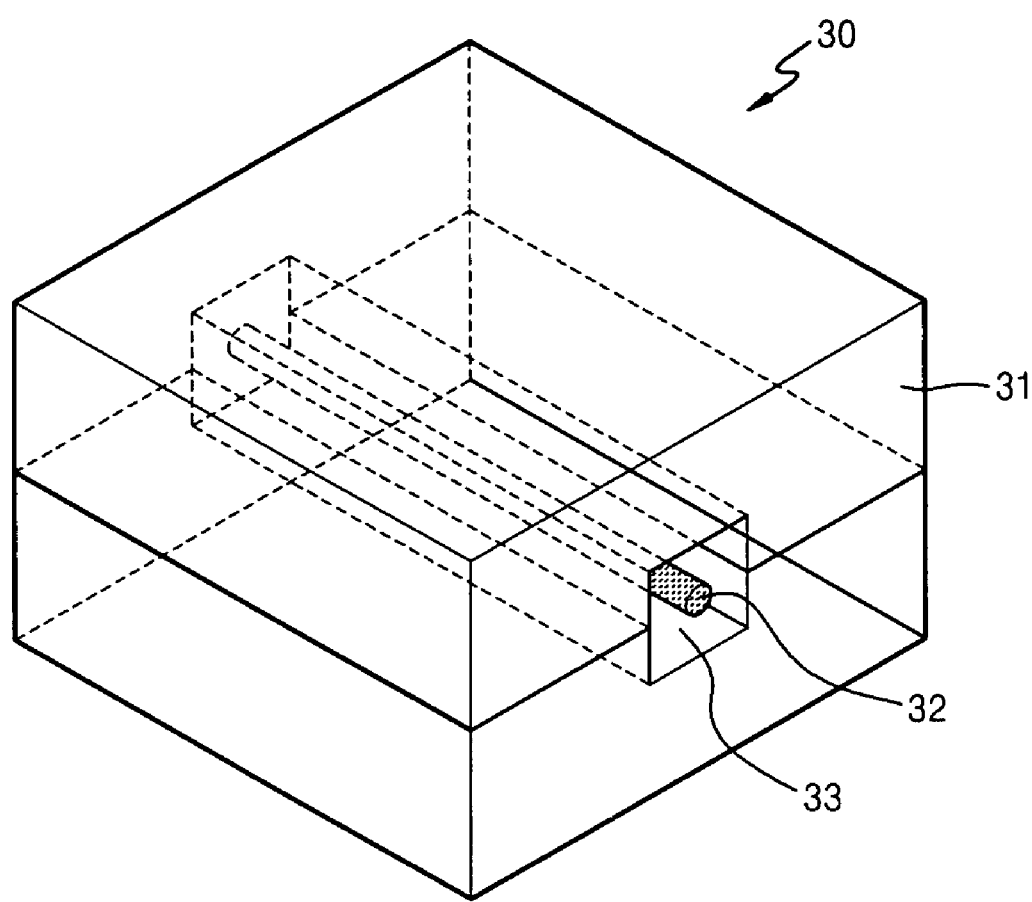

Referring to FIG. 3, the interposer 30 may include a semiconductor substrate 31, a metal interconnect 32, and an air gap 33. That is, the semiconductor substrate 31 may be insulated from the metal interconnect 32 using the air gap 33 formed between the metal interconnect 32 and the semiconductor substrate 31. The metal interconnect 32 may be maintained within the air gap using a contact unit (not shown).

A dielectric constant $\in$ of air is 1, which is relatively small. But, the dielectric constant $\in$ of $SiO_2$ typically used as an ILD layer is about 4. The dielectric constant $\in$ of air is less than that of $SiO_2$ by approximately ¼. Therefore, the operation response speed for signal transfer may become faster by 4 times as compared with that using a conventional interposer.

Figure 4A:
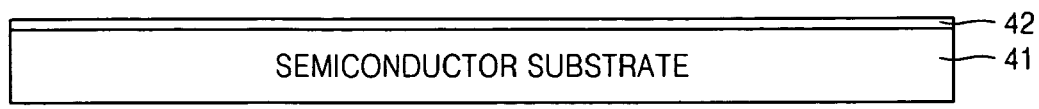
FIGS. 4A-4F illustrate fabricating an interposer according to an example embodiment of the present invention.
Figure 4B:
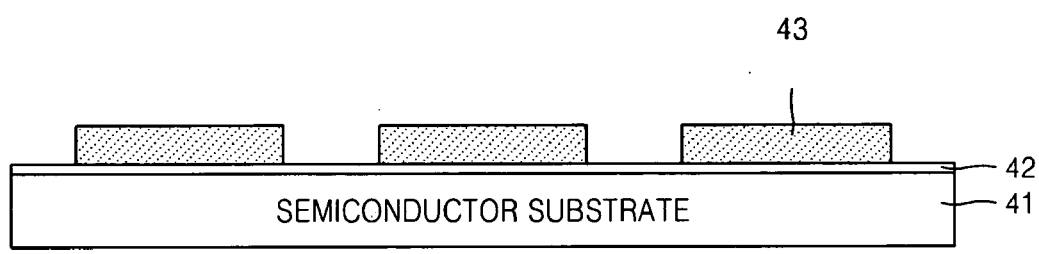
Figure 4C:
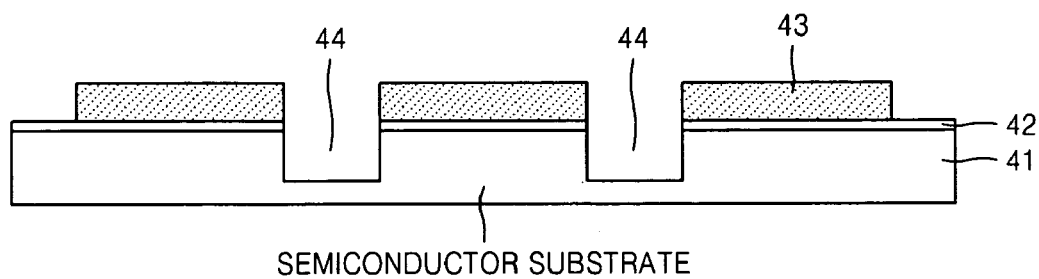
Figure 4D:
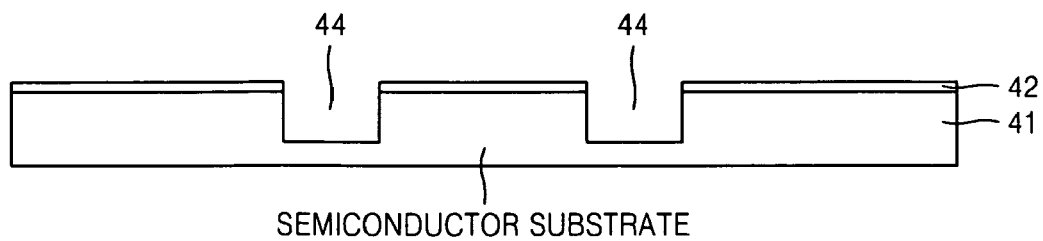
Figure 4E:
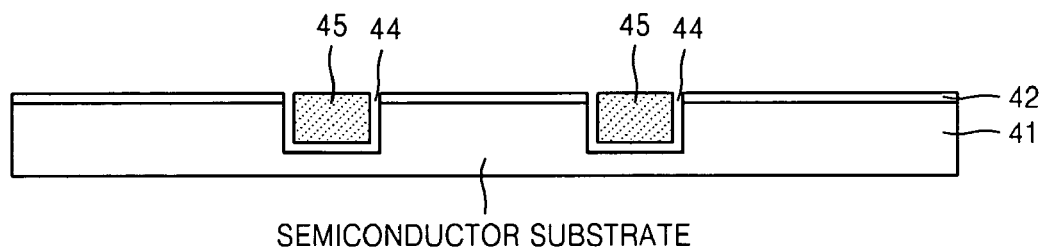

Referring to FIG. 4A, a semiconductor substrate 41 may be covered with an oxide layer 42. A photoresist 43 may be formed on the oxide layer 42 as shown in FIG. 4B. The photoresist 43 may be formed on a portion exclusive of a portion utilized in forming an air gap around a metal interconnect. Referring to FIG. 4C, a hole 44 may be formed, for example, by etching. The photoresist 43 may be removed (refer to FIG. 4D), and the metal interconnect 45 may be formed within the hole 44. The metal interconnect 45 may be formed using a Micro Electro Mechanical System (MEMS). In an example embodiment, the metal interconnect 45 may be fixed to a contact unit (not shown) formed to electrically connect the semiconductor substrate 41 to a semiconductor integrated circuit (IC).

Figure 4F:
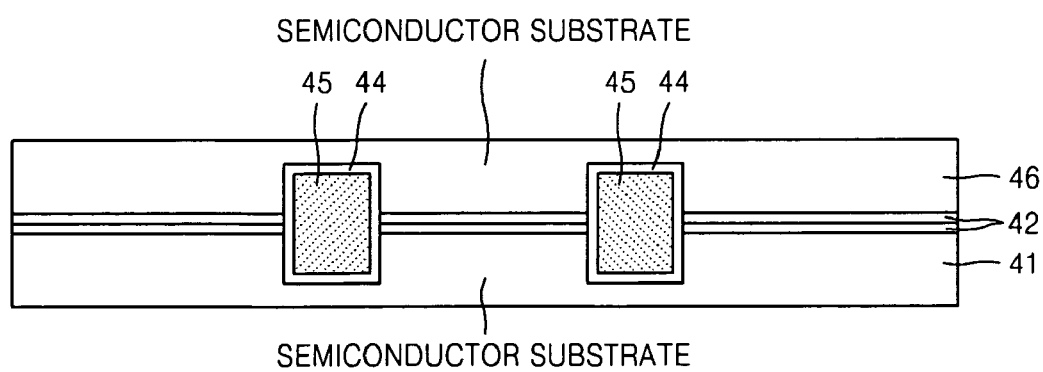

Referring to FIG. 4F, a semiconductor substrate 46 fabricated by the same way may be coupled to the semiconductor substrate 41. Consequently, an air gap 44 may be formed between the semiconductor substrates 41 and 46 and the metal interconnect 45.

Figure 5A:
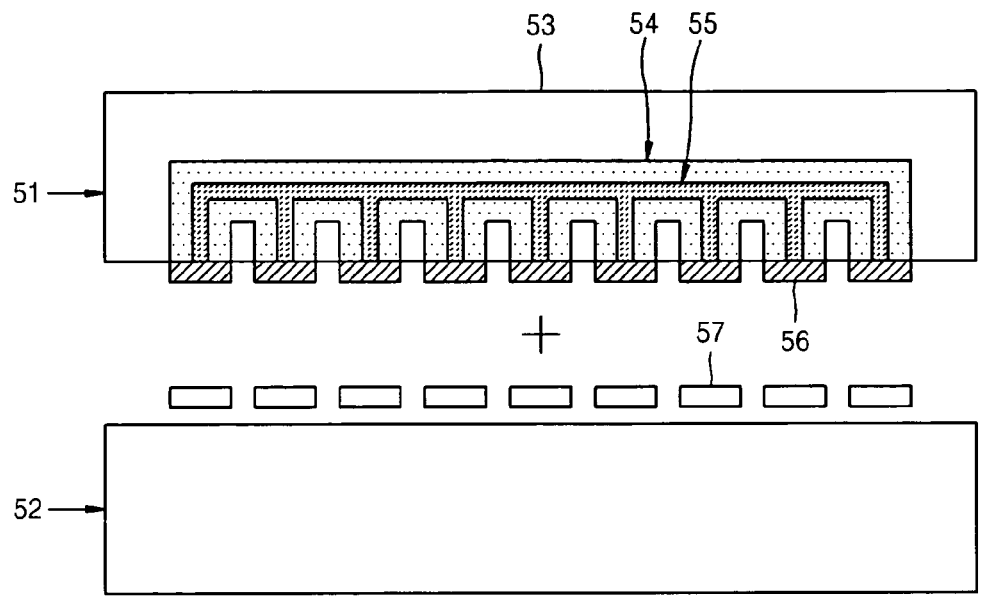
FIGS. 5A-5B illustrate a structure of one embodiment of the semiconductor device according to an example embodiment of the present invention.
Figure 5B:
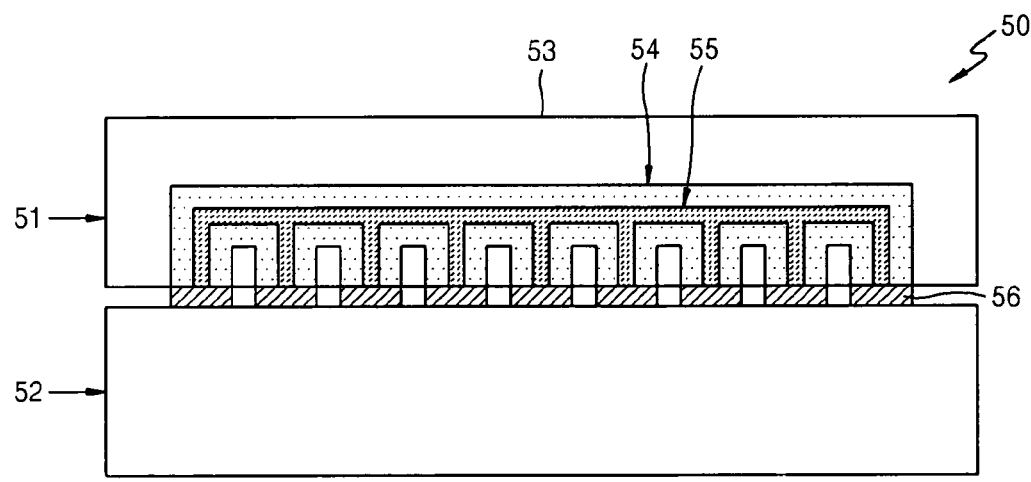

FIG. 5A is a diagram illustrating an interposer 51 according to an example embodiment of the present invention and a semiconductor IC 52 before coupling, and FIG. 5B is a diagram illustrating a semiconductor device 50 obtained by coupling the interposer 51 and the semiconductor IC 52.

Referring to FIG. 5A, the interposer 51 may include a semiconductor substrate 53, an air gap 54, a metal interconnect 55 and/or a contact unit 56. The semiconductor IC 52 may have a pad 57 to be bonded with the contact unit 56 of the semiconductor IC 52.

As described with reference to FIG. 3, the interposer 51 may use the air gap 54 between the metal interconnect 55 and the semiconductor substrate 53 as an insulating layer, thereby solving the capacitance issue that may be caused by a conventional insulating layer.

The semiconductor device 50 shown in FIG. 5B may be formed by coupling the interposer 51 and the semiconductor IC 52. In an example embodiment, the semiconductor IC 52 may include no internal connection interconnect for electrical connection of internal elements, e.g., the transistors, the capacitors, and resistors within the semiconductor IC 52, but the electrical connection may be attained by the metal interconnect 55 of the interposer 51.

The semiconductor device 50 according to an example embodiment of the present invention may use the air gap 54 with a low dielectric constant, thereby improving the operation reaction speed of the semiconductor device 50. Also, the electrical connection interconnect may be embodied by the interposer 51, and the semiconductor IC 52 may be arranged with the internal elements only. Therefore, the semiconductor device may be more easily fabricated and/or manufacturing cost of the semiconductor device operated at higher speed may be reduced.

Figure 6:
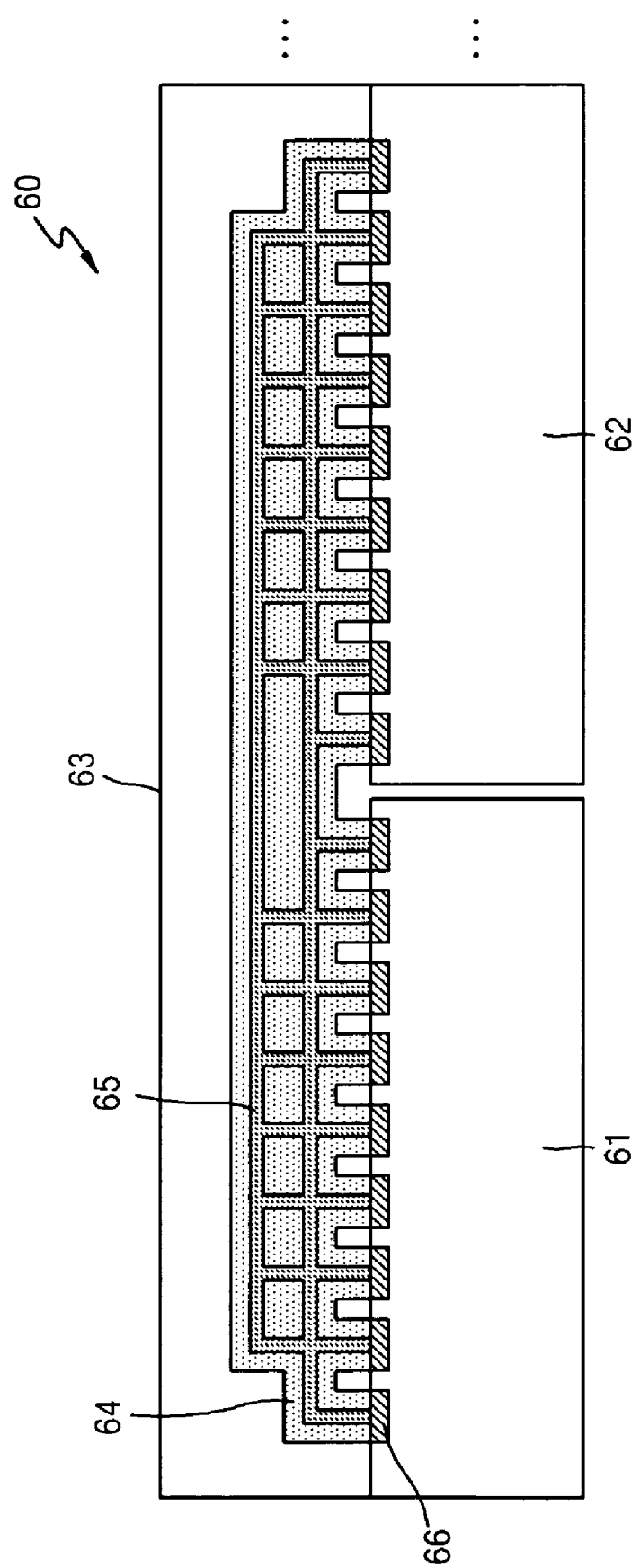

Referring to FIG. 6, the multi-chip package 60 may be fabricated by connecting at least one semiconductor chips to an interposer 63. For example, two semiconductor chips 61 and 62 may be connected to the interposer 63 in FIG. 6. For example, two semiconductor chips 61 and 62 may be connected to the interposer 63 in FIG. 6. The semiconductor chips 61 and 62 may have no internal interconnect structure for electrical connection, but may include only the internal elements such as transistors, capacitors and resistors. The electrical connection of the elements within respective chips and electrical connection of semiconductor chips may be accomplished by a metal interconnect 65 within the interposer 63. The metal interconnect 65 may be insulated from surroundings via an air gap 64, and fixed to the interposer 63 and the semiconductor chips 61 and 62 via a contact unit 66. In an example embodiment, the contact unit 66 may not only electrically connect the metal interconnect 65 of the interposer 63 to the elements within the semiconductor chips 61 and 62, but may also fix the metal interconnect 65.

In the multi-chip package 60 illustrated in FIG. 6, semiconductor chips 61 and 62 may be connected via the interposer 63 to reduce an area occupied by the multi-chip package 60 compared with cases where the electrical interconnect between the semiconductor chips is formed on a semiconductor substrate.

Additionally, there may be no capacitance problem caused by the electrical interconnect between the semiconductor chips. The metal interconnect within the interposer may be insulated via the air gap to decrease the capacitance load resulting from the insulating layer. Consequently, the response speed of the semiconductor device may be improved and/or fabrication of the semiconductor device operable at higher speed may be facilitated.

FIG. 7A is a diagram showing an example of connecting the semiconductor device including a single semiconductor chip to a PCB, and FIG. 7B is a diagram showing one example of connecting a multi-chip package to a PCB.

Referring to FIG. 7A, the interposer 51 may have a contact area larger than the semiconductor IC 52. An external pad 73 may be formed on an area of the interposer 51 other than the area of the interposer 51 overlapped by the semiconductor IC 52. The external pad 73 may be connected to a contact pad 72 on the PCB 71 via a bonding wire 74.

Referring to FIG. 7B, the interposer 63 may occupy an area greater than a sum of areas of two semiconductor chips 61 and 62. The external pad 73 may be formed on a portion of the interposer 63 other than the portion overlapped by the semiconductor chips 61 and 62. The external pad 73 may be connected to the contact pad 72 on the PCB 71 via the bonding wire 74.

FIG. 8A is a diagram showing an example of connecting the semiconductor device including a single semiconductor chip to the PCB, and FIG. 8B is a diagram showing one example of connecting the multi-chip package to the PCB.

Referring to FIG. 8A, the interposer 51 may have an area equal to that of the semiconductor IC 52, and may be coupled to the semiconductor IC 52. An external pad 81 may be disposed on the interposer 51 overlapped by the PCB 71. The external pad 81 may be directly connected to a contact pad 82 on the PCB 71. The external pad 81 may be a ball grid array.

As illustrated in FIG. 8B, the interposer 63 coupled to two semiconductor chips 61 and 62 may have an area equal to a sum of areas of the two semiconductor chips 61 and 62. The external pad 81 may be disposed on the interposer 63 overlapped by the PCB 71. The external pad 81 may be directly connected to the contact pad 82 on the PCB 71. The external pad 81 may be a ball grid array.

In an interposer of a semiconductor device of an example embodiment of the present invention, a substance, e.g. air, with a lower dielectric constant may be used as an insulating layer that encircles a metal interconnect within the interposer, such that a capacitance may be lowered, as compared with using the conventional interlayer insulating layer, e.g. $SiO_2$. Therefore, an operation response speed of the semiconductor device may be improved, thereby assisting to develop a semiconductor device operating at higher speed.

Also, the electrical connection interconnect may be embodied by the interposer, and a semiconductor IC may be arranged with the internal elements only, thereby facilitating the fabrication of the semiconductor device at decreased manufacturing costs.

Moreover, in view of a multi-chip package, semiconductor chips may be connected using the interposer. Accordingly, an area occupied by the multi-chip package may be reduced as compared with forming the inter-chip electrical interconnect on a substrate.

The foregoing is illustrative of the example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device, comprising:
    an interposer having a semiconductor substrate and a metal interconnect and electrically connected between internal elements formed within a semiconductor integrated circuit,
    wherein the metal interconnect is insulated from the semiconductor substrate using a void, the void being located between the metal interconnect and the semiconductor substrate to form an air gap, and
    wherein the metal interconnect is entirely enclosed within the semiconductor substrate such that the air gap is between the metal interconnect and the semiconductor substrate.

2. The semiconductor device of claim 1, further comprising:
    at least one contact element formed on one side of the metal interconnect to electrically connect the metal interconnect to the semiconductor integrated circuit, wherein the at least one contact element is attached to the semiconductor substrate.

3. The semiconductor device of claim 2, wherein the metal interconnect is maintained within the air gap by the contact element.

4. The semiconductor device of claim 1, wherein the metal interconnect is fabricated using a micro electro mechanical system (MEMS).

5. The semiconductor device of claim 1, wherein
the semiconductor integrated circuit includes a circuit unit having the internal elements, wherein the metal interconnect of the interposer is electrically connected to the internal elements.

6. The semiconductor device of claim 5, wherein the semiconductor integrated circuit has no internal metal interconnect for electrical connection of internal elements.

7. The semiconductor device of claim 5, wherein an area of the interposer is equal to an area of the semiconductor integrated circuit.

8. The semiconductor device of claim 5, wherein the area of the interposer is larger than the area of the semiconductor integrated circuit.

* * * * *